United States Patent
Sugie

(10) Patent No.: US 8,004,338 B2
(45) Date of Patent: Aug. 23, 2011

(54) PULSE GENERATOR

(75) Inventor: Hisashi Sugie, Kyoto (JP)

(73) Assignee: Rohm Co., Ltd. (JP)

( * ) Notice: Subject to any disclaimer, the term of this patent is extended or adjusted under 35 U.S.C. 154(b) by 112 days.

(21) Appl. No.: 12/439,652

(22) PCT Filed: Aug. 27, 2007

(86) PCT No.: PCT/JP2007/000916
§ 371 (c)(1),
(2), (4) Date: Mar. 20, 2009

(87) PCT Pub. No.: WO2008/026314
PCT Pub. Date: Mar. 6, 2008

(65) Prior Publication Data
US 2010/0007395 A1    Jan. 14, 2010

(30) Foreign Application Priority Data

Aug. 28, 2006  (JP) ................................ 2006-230940

(51) Int. Cl.
*G06F 1/04*    (2006.01)
*H03K 3/00*    (2006.01)
(52) U.S. Cl. ...................................................... 327/291
(58) Field of Classification Search .................. 331/143; 327/291
See application file for complete search history.

(56) References Cited

U.S. PATENT DOCUMENTS
2006/0097813 A1*  5/2006  Won .............................. 331/185

FOREIGN PATENT DOCUMENTS
| JP | 62-272616 A | 11/1987 |
| JP | 3-182115 A | 8/1991 |
| JP | 6-77781 A | 3/1994 |
| JP | 2006-140988 A | 6/2006 |

OTHER PUBLICATIONS

International Search Report for International Application No. PCT/JP2007/000916 mailed Sep. 18, 2007 with English Translation.
International Preliminary Report on Patentability for International Application No. PCT/JP2007/000916 issued Mar. 3, 2009 with English Translation.

* cited by examiner

*Primary Examiner* — Lincoln Donovan
*Assistant Examiner* — Daniel Rojas
(74) *Attorney, Agent, or Firm* — Cantor Colburn LLP

(57) ABSTRACT

At an occasion of a level transition when a second periodic voltage becomes equal to a main reference voltage a first periodic voltage generating circuit starts a first monotonically changing time-period in which a voltage value of a first periodic voltage increases monotonically from 0, which is an initial value, towards a voltage value of the main reference voltage. At an occasion of a level transition of a first main switching signal when the first periodic voltage becomes equal to the main reference voltage, a second periodic voltage generating circuit starts a second monotonically changing time-period in which a voltage value of the second periodic voltage increases monotonically from 0, which is an initial value, towards a voltage value of the main reference voltage.

5 Claims, 3 Drawing Sheets

800  COMPARATIVE EXAMPLE

PULSE GENERATOR

CROSS REFERENCE TO RELATED APPLICATIONS

This is a U.S. national stage of application No. PCT/JP2007/000916 filed on 27 Aug. 2007. Priority under 35 U.S.C. §119(a) and 35 U.S.C. §365(b) is claimed from Japanese Application No. 2006-230940 filed Aug. 28, 2006, the disclosure of which is also incorporated herein by reference.

BACKGROUND OF THE INVENTION

1. Field of the Invention

The present invention relates to technology for generating a periodic pulse signal.

2. Description of the Related Art

The oscillator circuit of Patent Document 1 is configured such that, after charging a capacitor from a ground potential to a reference potential, a discharge switch is turned ON and the capacitor is discharged to return from the reference potential to the ground potential, and a signal, which has time required for this sequence of charging and discharging as one period, is outputted.

Patent Document 1: Japanese Patent Application, Laid-Open No. S62-272616

An ON resistance of a switch configured as a MOSFET (Metal Oxide Semiconductor Field-Effect Transistor) or the like changes according to usage environment thereof. When the ON resistance of the switch changes, discharge time of the capacitor also changes. In the technology of Patent Document 1, the change in the discharge time directly becomes an error of the period of the output signal. When high accuracy is required in the period that it is as small as possible.

SUMMARY OF THE INVENTION

The present invention has been carried out in recognition of this situation, and a general purpose thereof is to provide technology for raising accuracy of a period of a pulse signal.

An embodiment of the present invention is a pulse generator. The pulse generator is provided with a periodic voltage generator which generates a plurality of periodic voltages, and a pulse signal output unit which outputs a pulse signal having a period determined in accordance with the plurality of periodic voltages. The periodic voltage generator generates the plurality of periodic voltages which periodically repeat respective monotonically changing time-periods in which a voltage value changes monotonically from an initial value towards a target value, and at an occasion of termination of a monotonically changing time-period of a certain periodic voltage, starts a monotonically changing time-period of another periodic voltage. The pulse signal output unit uses voltage of the monotonically changing time-period of at least one periodic voltage to set an edge of the pulse signal.

According to this embodiment, a period of a pulse signal is not affected by the monotonically changing time-period ending and the time until the voltage value of the periodic voltage returns to an initial value. Therefore even if this time changes due to usage environment or the like of a pulse generator, this change is prevented from causing an error in the period of the pulse signal, and accuracy of the period of the pulse signal is raised.

Another embodiment of the present invention is a pulse generator. The pulse generator is provided with a first periodic voltage generating circuit which charges and discharges a first capacitor and generates a first periodic voltage that periodically repeats a first monotonically changing time-period in which a voltage value changes monotonically from a first initial value towards a first main target value; a first main comparator which compares a voltage value of the first periodic voltage with the first main target value, and generates a first main switching signal that makes a level transition when these values are equal; a second periodic voltage generating circuit which charges and discharges a second capacitor and generates a second periodic voltage that periodically repeats a second monotonically changing time-period in which a voltage value changes monotonically from a second initial value towards a second main target value; a second main comparator which compares a voltage value of the second periodic voltage with the second main target value, and generates a second main switching signal that makes a level transition when these values are equal; and a pulse output circuit which uses the level transition of the first main switching signal and the second main switching signal to output a pulse signal in which an edge appears when the voltage value of the first periodic voltage reaches the first main target value from the first initial value and the voltage value of the second periodic voltage reaches the second main target value from the second initial value. The first periodic voltage generating circuit uses the level transition of the second main switching signal that occurs when the voltage value of the second periodic voltage reaches the second main target value from the second initial value, to start the first monotonically changing time-period, and the second periodic voltage generating circuit uses the level transition of the first main switching signal that occurs when the voltage value of the first periodic voltage reaches the first main target value from the first initial value, to start the second monotonically changing time-period.

According to this embodiment, since the period of the pulse signal outputted from the pulse output circuit is determined according to the length of the first monotonically changing time-period and the second monotonically changing time-period, the time from when the first monotonically changing time-period ends until the voltage value of the first periodic voltage returns to the first initial value, and the time from when the second monotonically changing time-period ends until the voltage value of the second periodic voltage returns to the second initial value does not affect the period of the pulse signal. Thus, even if these times change due to usage environment or the like of the pulse generator, the change is prevented from causing an error in the period of the pulse signal, and the accuracy of the period of the pulse signal is raised.

A further embodiment of the present invention is an electronic device. The electronic device is provided with the abovementioned pulse generator and a circuit which operates with output of the pulse generator as a clock.

According to this embodiment, since the accuracy of the period of the pulse signal used as the clock is high, performance of the electronic device can be raised.

An even further embodiment of the present invention is a pulse generation method of generating a periodic pulse signal. This method repeats steps of: charging or discharging a first capacitor, and monotonically changing a voltage value thereof from a first initial value towards a first main target value; comparing a voltage amount of the first capacitor with the first main target value, and generating a first main switching signal that makes a level transition when these levels become equal; using the level transition of the first main switching signal to set an edge of the pulse signal at timing at which the amount of the voltage of the first capacitor reaches the first main target value from the first initial value, and also starting charging or discharging a second capacitor; charging or discharging the second capacitor, and monotonically changing a voltage value thereof from a second initial value towards a second main target value; comparing a voltage amount of the second capacitor with the second main target value and generating a second main switching signal that makes a level transition when these levels become equal; and using the level transition of the second main switching signal to set an edge of the pulse signal at timing at which the amount of the voltage of the second capacitor reaches the second main target value from the second initial value, and also starting charging or discharging the first capacitor.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, a state in which "member A is connected to member B" includes cases in which the member A and the member B are directly and physically connected, and cases in which the member A and the member B are indirectly connected via another member that does not affect an electrical connection state.

In a similar way, "a state in which member C is arranged between member A and member B" includes, in addition to cases in which the member A and the member C, or the member B and the member C are directly connected, cases in which the members are indirectly connected via another member that does not affect an electrical connection state.

Figure 1:
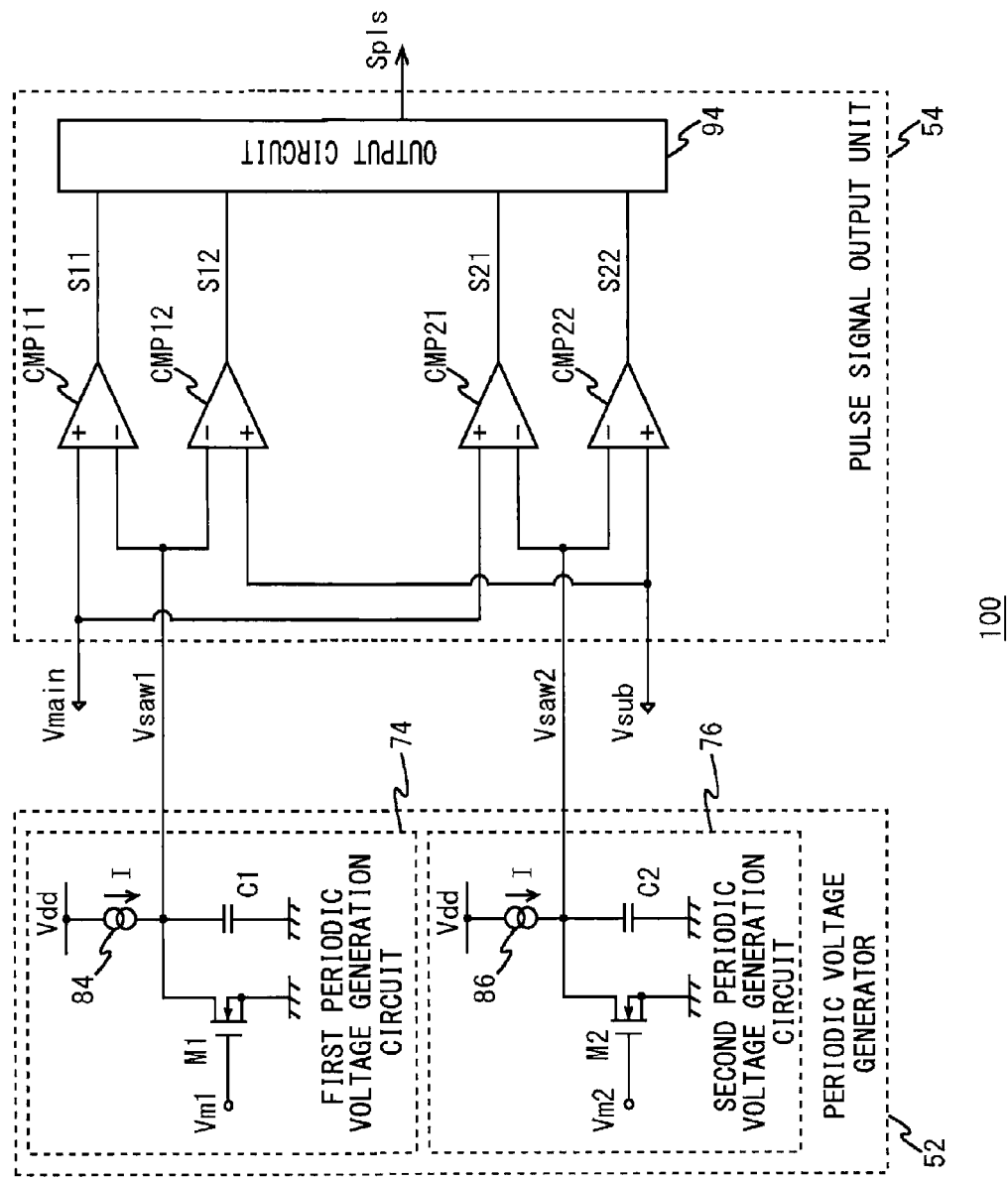
FIG. 1 is a circuit diagram showing a configuration of a pulse generator according to an embodiment.

FIG. 1 shows a configuration of a pulse generator 100 according to the embodiment. The pulse generator 100 can be used as a clock generation source used, for example, in a motor driver or the like, which drives a motor for a zoom lens, auto-focusing, or an aperture of a digital camera.

The pulse generator 100 is provided with a periodic voltage generator 52 and a pulse signal output unit 54, and is monolithically integrated on one semiconductor substrate together with another circuit block such as a motor driver or the like. Furthermore, "monolithically integrated" includes cases in which all component elements of the circuit are formed on the semiconductor substrate, and cases in which main component elements of the circuit are integrated, and some resistors or the like for adjusting a circuit constant may be arranged outside the semiconductor substrate. By monolithically integrating on one semiconductor substrate, installation in the electronic device becomes easier.

The periodic voltage generator 52 generates a first periodic voltage Vsaw1 and a second periodic voltage Vsaw2. The pulse signal output unit 54 outputs a pulse signal Spls whose period is determined according to the first periodic voltage Vsaw1 and the second periodic voltage Vsaw2.

The periodic voltage generator 52 has a first periodic voltage generating circuit 74 and a second periodic voltage generating circuit 76.

The first periodic voltage generating circuit 74 has a first capacitor C1, a first constant current source 84, and a first switch M1, and outputs voltage of the first capacitor C1 as the first periodic voltage Vsaw1. The first constant current source 84 and the first capacitor C1 are connected in series between a power supply terminal and a ground terminal, and the first switch M1 is arranged between a connection point thereof and a ground terminal. When the first switch M1 is OFF, the first capacitor C1 is charged by a current I from the first constant current source 84. When the first switch M1 is ON, the first capacitor C1 is discharged, and a voltage value thereof is initialized to 0.

The second periodic voltage generating circuit 76 has a second capacitor C2, a second constant current source 86, and a second switch M2, and outputs voltage of the second capacitor C2 as the second periodic voltage Vsaw2. The second constant current source 86 and the second capacitor C2 are connected in series between a power supply terminal and a ground terminal, and the second switch M2 is arranged between a connection point thereof and a ground terminal. When the second switch M2 is OFF, the second capacitor C2 is charged by a current I from the second constant current source 86. When the second switch M2 is ON, the second capacitor C2 is discharged, and a voltage value thereof is initialized to 0.

The first constant current source 84 and the second constant current source 86 are formed using a well-known current mirror circuit, and current values thereof become equal. Furthermore, the first capacitor C1 and the second capacitor C2 are configured so that capacitance values thereof are equal. The first switch M1 and the second switch M2 are electronic switches implemented by a MOSFET, for example, and in the present embodiment are configured as N-channel MOSFETs.

A first switch control signal Vm1 that performs ON-OFF control of the first switch M1 is obtained by passing a second main switching signal S21 and a second sub-switching signal S22, described later, through a well known logic gate, which is not shown in the figures. A logical expression of the first switch control signal Vm1 is represented as (S21 XOR S22) or (S21 AND *S22).

In a similar way, a second switch control signal Vm2 that performs ON-OFF control of the second switch M2 is obtained by passing a first main switching signal S11, described later, and a first sub-switching signal S12, through a well known logic gate, which is not shown in the figures. A logical expression of the second switch control signal Vm2 is represented as (S11 XOR S12) or (S11 AND *S12).

The pulse signal output unit 54 is provided with a first main comparator CMP11, a first sub-comparator CMP12, a second main comparator CMP21, a second sub-comparator CMP22, and an output circuit 94.

The first periodic voltage Vsaw1 is inputted to an inverting input terminal of the first main comparator CMP11, and a main reference voltage Vmain is inputted to a non-inverting input terminal. The first periodic voltage Vsaw1 is inputted to an inverting input terminal of the first sub-comparator CMP12, and a sub-reference voltage Vsub is inputted to a non-inverting input terminal. Furthermore, the voltage value of the sub-reference voltage Vsub is between 0 and the voltage value of the main reference voltage Vmain. That is, a relationship 0<Vsub<Vmain is established.

The second periodic voltage Vsaw2 is inputted to an inverting input terminal of the second main comparator CMP21, and the main reference voltage Vmain is inputted to a non-inverting input terminal. The second periodic voltage Vsaw2 is inputted to an inverting input terminal of the second sub-comparator CMP22, and the sub-reference voltage Vsub is inputted to a non-inverting input terminal.

The first main comparator CMP11 compares the voltage value of the main reference voltage Vmain and the voltage value of the first periodic voltage Vsaw1, and generates the first main switching signal S11 that makes a level transition when these levels become equal. The first sub-comparator CMP12 compares the voltage value of the sub-reference voltage Vsub and the voltage value of the first periodic voltage Vsaw1, and generates the first sub-switching signal S12 that makes a level transition when these levels become equal.

The second main comparator CMP21 compares the voltage value of the main reference voltage Vmain and the voltage value of the second periodic voltage Vsaw2, and generates the second main switching signal S21 that makes a level transition when these voltage values become equal. The second sub-comparator CMP22 compares the voltage value of the sub-reference voltage Vsub and the voltage value of the second periodic voltage Vsaw2, and generates the second sub-switching signal S22 that makes a level transition when these levels become equal.

The output circuit 94 outputs a pulse signal Spls based on the first main switching signal S11 and the first sub-switching signal S12, and the second main switching signal S21 and the second sub-switching signal S22. The pulse signal Spls is the final output of the pulse generator 100. Furthermore, the output circuit 94 is configured by combining well-known logic gates.

Below, operation of the pulse generator 100 is explained by a time chart while referring to FIG. 1.

Figure 2:
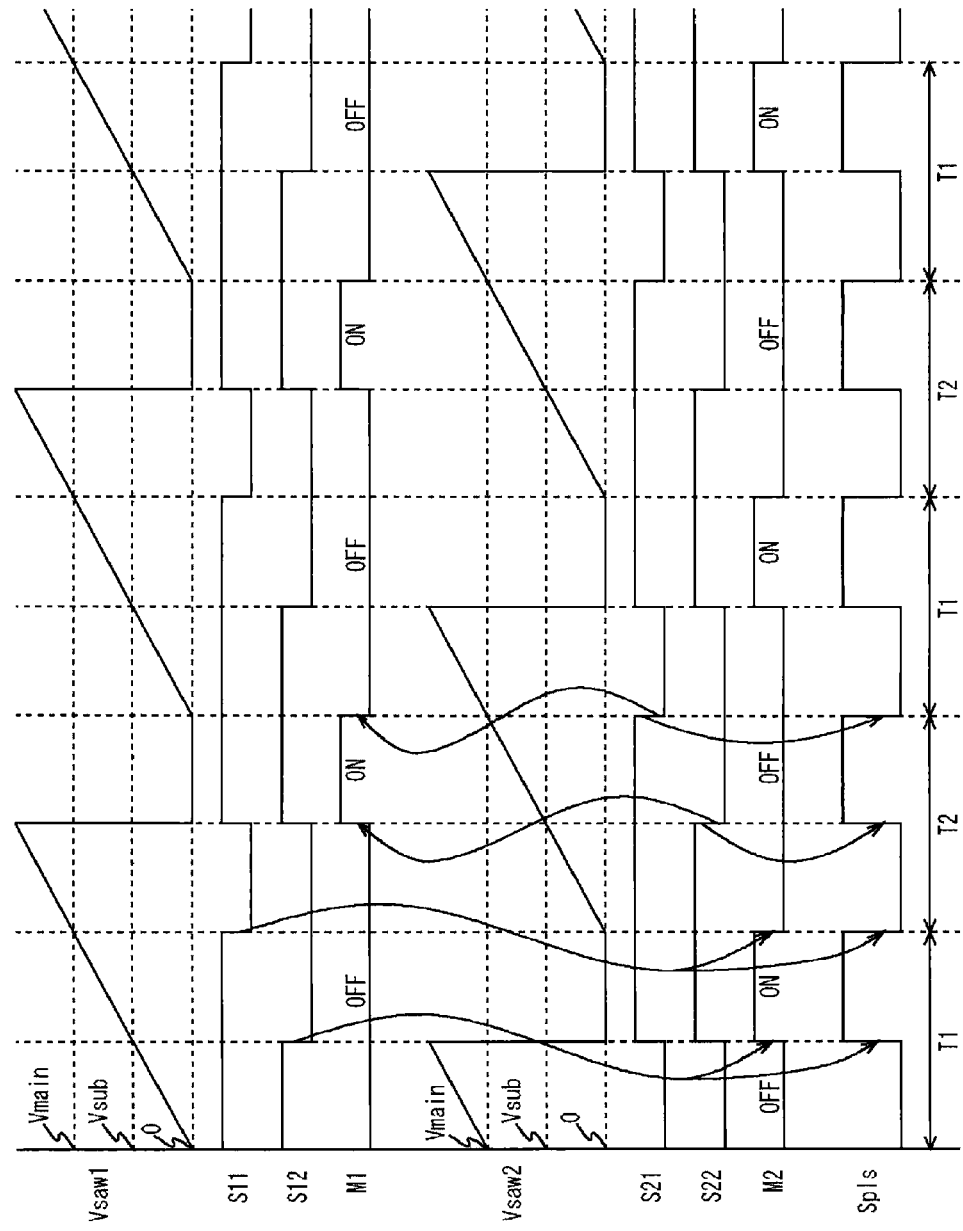
FIG. 2 is a time chart showing operation of the pulse generator shown in FIG. 1.

FIG. 2 is a time chart showing the operation of the pulse generator 100 shown in FIG. 1. The time chart shows, in order, from the top, the first periodic voltage Vsaw1, the first main switching signal S1, the first sub-switching signal S12, ON-OFF status of the first switch M1, the second periodic voltage Vsaw2, the second main switching signal S21, the second sub-switching signal S22, ON-OFF status of the second switch M2, and the pulse signal Spls.

The first periodic voltage generating circuit 74 turns the first switch M1 OFF, and charges the first capacitor C1, whose voltage is initialized to 0, by the first constant current source 84. In this way, a first monotonically changing time-period T1 is started, in which the voltage value of the first periodic voltage Vsaw1 increases monotonically from an initial value of 0 towards the voltage value of the main reference voltage Vmain.

When the first periodic voltage Vsaw1 becomes equal to the sub-reference voltage Vsub, the first sub-switching signal S12 transits from a high level to a low level. The output circuit 94 sets a positive edge of the pulse signal Spls at timing of this level transition. In addition, the second periodic voltage generating circuit 76 turns the second switch M2 ON at an occasion of this level transition, and initializes the voltage value of the second capacitor C2 to 0. Together with the voltage value of the second capacitor C2 being initialized to 0, the second main switching signal S21 and the second sub-switching signal S22 go to a high level.

When the first periodic voltage Vsaw1 becomes equal to the main reference voltage Vmain, the first main switching signal S11 transits from a high level to a low level. The output circuit 94 sets a negative edge of the pulse signal Spls at timing of this level transition. In addition, the second periodic voltage generating circuit 76 turns the second switch M2 OFF at an occasion of this level transition, and charges the second capacitor C2 by the second constant current source 86. In this way, a second monotonically changing time-period T2 is started, in which the voltage value of the second periodic voltage Vsaw2 increases monotonically from an initial value of 0 towards the voltage value of the main reference voltage Vmain. Furthermore, the first main switching signal S11 transiting from a high level to a low level means the end of the first monotonically changing time-period T1. That is, the second periodic voltage generating circuit 76 uses the level transition of the first main switching signal S11 that occurs when the voltage value of the first periodic voltage Vsaw1 reaches the voltage value of the main reference voltage Vmain from the initial value, to start the second monotonically changing time-period T2, at an occasion of the ending of the first monotonically changing time-period T1.

When the second periodic voltage Vsaw2 becomes equal to the sub-reference voltage Vsub, the second sub-switching signal S22 transits from a high level to a low level. The output circuit 94 sets a positive edge of the pulse signal Spls at timing of this level transition. Furthermore, the first periodic voltage generating circuit 74 turns the first switch M1 ON at an occasion of this level transition, and initializes the voltage value of the first capacitor C1 to 0. Together with the voltage value of the first capacitor C1 being initialized to 0, the first main switching signal S11 and the first sub-switching signal S12 go to a high level.

When the second periodic voltage Vsaw2 becomes equal to the main reference voltage Vmain, the second main switching signal S21 transits from a high level to a low level. The output circuit 94 sets a negative edge of the pulse signal Spls at timing of this level transition. Furthermore, the first periodic voltage generating circuit 74 turns the first switch M1 OFF at an occasion of this level transition, and charges the first capacitor C1 by the first constant current source 84. In this way the first monotonically changing time-period T1 of a subsequent cycle starts. Furthermore, the second main switching signal S21 transiting from a high level to a low level means the end of the second monotonically changing time-period T2. That is, the first periodic voltage generating circuit 74 uses the level transition of the second main switching signal S21 that occurs when the voltage value of the second periodic voltage Vsaw2 reaches the voltage value of the main reference voltage Vmain from the initial value, to start the first monotonically changing time-period T1, at an occasion of the ending of the second monotonically changing time-period T2.

By repeating the above operations, the first monotonically changing time-period T1 and the second monotonically changing time-period T2 alternately repeat. Furthermore, since current values of the first constant current source 84 and the second constant current source 86 are equal and capacitance values of the first capacitor C1 and the second capacitor C2 are equal, lengths of the first monotonically changing time-period T1 and the second monotonically changing time-period T2 are equal. This length is one period of the pulse signal Spls.

In the pulse generator 100 of the present embodiment it should be noted that the length of the initialization time-period (referred to below as "initialization time"), in which the first capacitor C1 and the second capacitor C2 are discharged and voltage values thereof are initialized to 0, does not affect the period of the pulse signal Spls. That is, since the period of the pulse signal Spls is determined by the lengths of the first monotonically changing time-period T1 and the second monotonically changing time-period T2, the period of the pulse signal Spls is not affected by the initialization time. When the initialization time changes due to external environment, since in the present embodiment the occurrence of an error in the period of the pulse signal Spls due to the change in the initialization time is prevented in this way, the accuracy of the period of the pulse signal Spls is raised.

Furthermore, while the technology of Patent Document 1 takes as one period the time required for a sequence of charging and discharging, in which, after charging a capacitor from a ground potential to a reference potential, the capacitor is discharged from the reference potential back to the ground potential, in the present embodiment since each of the first monotonically changing time-period T1 and the second monotonically changing time-period T2 is one period, frequency of the pulse signal Spls can be increased.

Below, making reference to a comparative example, an effect of the present embodiment is explained from another viewpoint. The comparative example shows a case in which a pulse signal is generated using, for example, a triangular wave generating circuit as described in FIG. 4 of Japanese Patent Application, Laid-Open No. 2006-20177.

Figure 3:
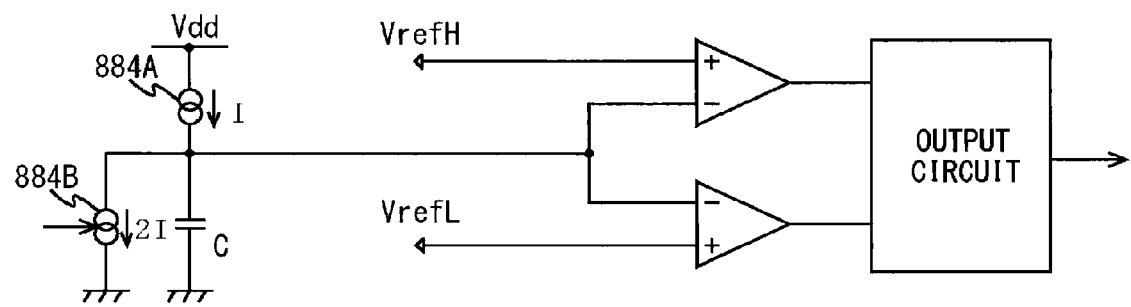
FIG. 3 is a circuit diagram showing a configuration of a pulse generator according to a comparative example.

FIG. 3 shows a configuration of a pulse generator 800 according to the comparative example. In a charging time-period, the pulse generator 800 charges a capacitor C by a charging constant current source 884A, with a discharging constant current source 884B in an OFF state, and when the voltage value of the capacitor C becomes equal to a voltage value of a high potential reference voltage VrefH, moves to a discharging time-period; and in a discharging time-period, the pulse generator 800 discharges the capacitor C, with the discharging constant current source 884B in an ON state, and when the voltage value of the capacitor C becomes equal to a voltage value of a low potential reference voltage VrefL, moves to a charging time-period. During repetition of these operations, each time the voltage value of the capacitor C becomes equal to the voltage value of the high potential reference voltage VrefH and to the low potential reference voltage VrefL, an output circuit generates a pulse signal having an edge. Furthermore, the charging constant current source 884A and the discharging constant current source 884B are configured as current mirror circuits. Since a current value of the charging constant current source 884A is I, and a current value of the discharging constant current source 884B is 2I, a total current value of a discharging current of the capacitor C in a discharging time-period is I.

When the discharging constant current source 884B is turned ON when the discharging time-period is started, a transient type of current (below, referred to as "transient current") at this start-up time changes due to external environment. The change in the transient current causes an error in a period of an output pulse signal of the pulse generator 800. With regard to this point, in the pulse generator 100 of the present embodiment, since turning ON and OFF a current source by providing two periodic voltage generating circuits for determining the period of the pulse signal Spls is not necessary, occurrence of an error in the period of the pulse signal Spls caused by the change in the transient current is prevented, and accuracy is raised.

Furthermore, in the pulse generator 800 of the comparative example, if response speed of a comparator is changed by the external environment, the voltage value of the capacitor changes at both starting and ending of the charging time-period. In this way, the length of the charging time-period and the discharging time-period changes, and an error occurs in the period of the output pulse signal of the pulse generator 800. In comparison to this, in the pulse generator 100 of the present embodiment the voltage value, when charging of the first capacitor C1 and the second capacitor C2 is started, is initialized to a ground potential, that is, a stable fixed potential. That is, since the voltage values of the first periodic voltage Vsaw1 and the second periodic voltage Vsaw2 are relatively stable at the start of the first monotonically changing time-period T1 and the second monotonically changing time-period T2, a pulse signal having a period of higher accuracy than the pulse generator 800 of the comparative example can be generated.

The abovementioned embodiment is an example, and a person skilled in the art will understand that various modifications in combinations of various component elements and various processes thereof are possible, and that such modified examples are within the scope of the present invention. Below, modified examples are listed.

Modified Example

In the embodiment described above, each of the lengths of the first monotonically changing time-period T1 and the second monotonically changing time-period T2, which have equal lengths, is taken as one period of the pulse signal Spls. In a modified example, the total of the lengths of the first monotonically changing time-period T1 and the second monotonically changing time-period T2 is taken as one period of the pulse signal Spls. In such a case, the output circuit 94 does not use a level transition of the first sub-switching signal S12 and a level transition of the second sub-switching signal S22 in setting an edge of the pulse signal Spls, but sets a positive edge of the pulse signal Spls at timing at which the first main switching signal S11 transits from a high level to a low level, and sets a negative edge of the pulse signal Spls at timing at which the second main switching signal S21 transits from a high level to a low level.

The present modified example also achieves an effect similar to the embodiment. Additionally, according to the present modified example, consideration need not be particularly given to making capacitance values of the first capacitor C1 and the second capacitor C2 equal, or to making current values of the first constant current source 84 and the second constant current source 86 equal. That is, when each of the lengths of the first monotonically changing time-period T1 and the second monotonically changing time-period T2 is taken as one period of the pulse signal Spls, as in the embodiment, consideration must be given to making the lengths of the first monotonically changing time-period T1 and the second monotonically changing time-period T2 equal, but in the present modified example the total of the lengths of the first monotonically changing time-period T1 and the second monotonically changing time-period T2 is taken as one period of the pulse signal Spls, so that such consideration is unnecessary. In this way, the pulse generator 100 is easy to manufacture.

Furthermore, since even if the lengths of the first monotonically changing time-period T1 and the second monotonically changing time-period T2 in the present modified example are different, this does not cause an error in the period of the pulse signal Spls, and it is possible to raise the accuracy of the period of the pulse signal Spls even further than in the embodiment. However, in the present modified example, the frequency of the pulse signal Spls is half that of cases of the embodiment. Usage of either the embodiment or the present modified example may be changed as appropriate according to required frequency or accuracy. According to the present type of modified example, application scope of the pulse generator 100 is widened.

Other Modified Examples

In the embodiment, two periodic voltage generating circuits for determining the period of the pulse signal Spls were provided, but there is no limitation thereto, and three or more periodic voltage generating circuits may be provided. An effect similar to the embodiment is also obtained in such cases.

In the embodiment, two comparators are provided for each of the first periodic voltage Vsaw1 and the second periodic voltage Vsaw2, but there is no limitation thereto, and three comparators may be provided for each of the first periodic voltage Vsaw1 and the second periodic voltage Vsaw2. Specifically, two other sub-comparators are additionally provided, inputting a sub-reference voltage other than the main reference voltage Vmain and the sub-reference voltage Vsub to a non-inverting input terminal, and inputting each of the first periodic voltage Vsaw1 and the second periodic voltage Vsaw2 to a non-inverting input terminal. The output circuit 94 also uses level transitions of output signals of these other two sub-comparators in setting edges of the pulse signal Spls. According to this, it is possible to increase the frequency of the pulse signal Spls. In the same way, by further increasing the number of comparators, it is also possible to further increase the frequency of the pulse signal Spls.

In the embodiment, a first sub-comparator CMP12 and a second sub-comparator CMP22 are configured based on a dual input differential amplifier, but alternatively an inverter may be used. In such cases, the inverter is configured such that there is a transition in output level, with input between 0 and the voltage value of the main reference voltage Vmain. That is, a threshold of the inverter is used as the sub-reference voltage Vsub. In cases in which accuracy is not required in duty ratio of the pulse signal Spls, by configuring the first sub-comparator CMP12 and the second sub-comparator CMP22 as inverters as in the present modified example, it is possible to reduce circuit scale of the pulse generator 100.

Instead of the first sub-comparator CMP12 of the embodiment, a timer may be provided which, at an occasion at which the second monotonically changing time-period T2 ends, measures a time shorter than the length of the first monotonically changing time-period T1, and when this time has passed, there is a transition in output level. By using this level transition, an effect similar to the embodiment is obtained. The same may be said concerning the second sub-comparator CMP22.

In the embodiment, cases in which the initial values of the voltage values of the first periodic voltage Vsaw1 and the second periodic voltage Vsaw2 are smaller than the voltage value of the main reference voltage Vmain are illustrated by example, but there is no limitation thereto, and the size relationships thereof may be reversed. That is, the first monotonically changing time-period T1 and the second monotonically changing time-period T2 may be time-periods in which each of the voltage values of the first periodic voltage Vsaw1 and the second periodic voltage Vsaw2 decrease monotonically from the initial value towards the voltage value of the main reference voltage Vmain.

In the embodiment, the first switch M1 and the second switch M2 are provided to initialize the voltage values of the first periodic voltage Vsaw1 and the second periodic voltage Vsaw2, but there is no limitation thereto, and a discharging current source may be used in place thereof. In such cases, by setting to the initial value the voltage value of each of the first capacitor C1 and the second capacitor C2 by the time of starting each of the first monotonically changing time-period T1 and the second monotonically changing time-period T2, an effect similar to the embodiment can be achieved.

In the embodiment, the respective first capacitor C1 and second capacitor C2 are charged by the respective first constant current source 84 and second constant current source 86, but there is no limitation thereto, and instead of the first constant current source 84 and the second constant current source 86, a first resistor and a second resistor may be used and these resistors may be operated as current sources. In such cases, it is possible to achieve an effect similar to the embodiment.

In the embodiment, the voltage values of each of the first periodic voltage Vsaw1 and the second periodic voltage Vsaw2 are compared with the voltage value of the main reference voltage Vmain by the first main comparator CMP11 and the second main comparator CMP21. In the modified example, functions of the first main comparator CMP11 and the second main comparator CMP21 may be realized by sharing one comparator by time division (below, this one comparator is referred to as a "shared comparator" or "common comparator"). In such cases, a selector is provided to select either of the first periodic voltage Vsaw1 and the second periodic voltage Vsaw2, and the selected voltage is inputted to an inverting input terminal of the shared comparator. The selector switches input to the shared comparator from the first periodic voltage Vsaw1 to the second periodic voltage Vsaw2 at an occasion at which the first monotonically changing time-period T1 ends, and switches input to the shared comparator from the second periodic voltage Vsaw2 to the first periodic voltage Vsaw1, at an occasion at which the second monotonically changing time-period T2 ends. In this way, the selector alternately inputs the first periodic voltage Vsaw1 and the second periodic voltage Vsaw2 to the shared comparator. According to the present modified example, circuit scale can be reduced by reducing the number of comparators. Functions of the first sub-comparator CMP12 and the second sub-comparator CMP22 can be similarly realized by sharing one comparator by time division.

Furthermore, setting of a logical value for the high level and the low level described in the embodiment is one example, and it is possible to freely make modifications by appropriate inversion by an inverter or the like.

While the preferred embodiments of the present invention have been described using specific terms, such description is for illustrative purposes only, and it is to be understood that changes and variations may be made without departing from the spirit or scope of the appended claims.

The invention claimed is:

1. A pulse generator comprising;
    a first periodic voltage generating circuit which charges and discharges a first capacitor and generates a first periodic voltage that periodically repeats a first changing time-period in which a voltage value changes from a first initial value towards a first main target value with a constant slope;
    a first main comparator which compares a voltage value of the first periodic voltage with the first main target value, and generates a first main switching signal that makes a level transition when these values are equal;
    a second periodic voltage generating circuit which charges and discharges a second capacitor and generates a second periodic voltage that periodically repeats a second changing time-period in which a voltage value changes from a second initial value towards a second main target value with a constant slope;

a second main comparator which compares a voltage value of the second periodic voltage with the second main target value, and generates a second main switching signal that makes a level transition when these values are equal; and a pulse output circuit which uses the level transition of the first main switching signal and the second main switching signal to output a pulse signal in which an edge appears when the voltage value of the first periodic voltage reaches the first main target value from the first initial value and the voltage value of the second periodic voltage reaches the second main target value from the second initial value; wherein the first periodic voltage generating circuit uses the level transition of the second main switching signal that occurs when the voltage value of the second s eriodic voltage reaches the second main target value from the second initial value, to start the first changing time-period, and the second periodic voltage generating circuit uses the level transition of the first main switching signal that occurs when the voltage value of the first periodic voltage reaches the first main target value from the first initial value, to start the second changing time-period, and wherein the pulse generator further comprises:

a first sub-comparator which compares the voltage value of the first periodic voltage with a first sub-target value between the first initial value and the first main target value, and generates a first sub-switching signal that makes a level transition when these values are equal; and a second sub-comparator which compares the voltage value of the second periodic voltage with a second sub-target value between the second initial value and the second main target value, and generates a second sub-switching signal that makes a level transition when these values are equal; wherein the first periodic voltage generating circuit and the second periodic voltage generating circuit are configured such that the first changing time-period and the second changing time-period have equal lengths, and the pulse output circuit uses the level transitions of the first sub-switching signal and the second sub-switching signal to output a pulse signal in which an edge appears when the voltage value of the first periodic voltage reaches the first sub-target value from the first initial value and when the voltage value of the second periodic voltage reaches the second sub-target value from the second initial value.

2. The pulse generator according to claim 1, wherein the first periodic voltage generating circuit uses the level transition of the second sub-switching signal to set a voltage value of the first capacitor to an initial value, at an occasion at which the voltage value of the second periodic voltage reaches the second sub-target value from the second initial value; and the second periodic voltage generating circuit uses the level transition of the first sub-switching signal to set a voltage value of the second capacitor to an initial value, at an occasion at which the voltage value of the first periodic voltage reaches the first sub-target value from the first initial value.

3. The pulse generator according to claim 1, wherein the pulse generator is monolithically integrated on one semiconductor substrate.

4. An electronic device comprising:

the pulse generator according to claim 1; and a circuit which operates with output of the pulse generator as a clock.

5. A pulse generation method of generating a periodic pulse signal, the method comprising repeating the steps of:

charging or discharging a first capacitor, and changing a voltage value thereof from a first initial value towards a first main target value with a constant slope;

comparing a voltage value of the first capacitor with the first main target value and generating a first main switching signal that makes a level transition when these values become equal;

using the level transition of the first main switching signal to set an edge of the pulse signal at timing at which the voltage value of the first capacitor reaches the first main target value from the first initial value and also starting charging or discharging a second capacitor;

charging or discharging the second capacitor, and changing a voltage value thereof from a second initial value towards a second main target value with a constant slope;

comparing a voltage value of the second capacitor with the second main target value and generating a second main switching signal that makes a level transition when these values become equal; and using the level transition of the second main switching signal to set an edge of the pulse signal at timing at which the voltage value of the second capacitor reaches the second main target value from the second initial value, and also starting charging or discharging the first capacitor, and wherein lengths of a first changing time-period in which a voltage value of the first capacitor reaches the first main target value from the first initial value and a second changing time-period in which a voltage value of the second capacitor reaches the second main target value from the second initial value are equal, the method comprising repeating the further steps of:

comparing a voltage value of the first capacitor with a first sub-target value between the first initial value and the first main target value, and generating a first sub-switching signal that makes a level transition when these values become equal;

using the level transition of the first sub-switching signal to set an edge of the pulse signal at timing at which the voltage value of the first capacitor reaches the first sub-target value from the first initial value;

comparing a voltage value of the second capacitor with a second sub-target value between the second initial value and the second main target value, and generating a second sub-switching signal that makes a level transition when these values become equal; and using the level transition of the second sub-switching signal to set an edge of the pulse signal at timing at which the voltage value of the second capacitor reaches the second sub-target value from the second initial value.

* * * * *

UNITED STATES PATENT AND TRADEMARK OFFICE
CERTIFICATE OF CORRECTION

PATENT NO. : 8,004,338 B2
APPLICATION NO. : 12/439652
DATED : August 23, 2011
INVENTOR(S) : Hisashi Sugie Page 1 of 1

It is certified that error appears in the above-identified patent and that said Letters Patent is hereby corrected as shown below:

Title Page;
This patent currently states (86) PCT No. PCT/JP2007/000916 371 (c)(1), (2), (4) as "Mar. 20, 2009". The correct date should be "Mar. 2, 2009".

Signed and Sealed this
Fifteenth Day of November, 2011

David J. Kappos
*Director of the United States Patent and Trademark Office*